US011296732B2

(12) United States Patent
Chen et al.

(10) Patent No.: US 11,296,732 B2
(45) Date of Patent: Apr. 5, 2022

(54) RADIO FREQUENCY SIGNAL TRANSMISSION CIRCUIT WITH A HIGH SWITCHING SPEED

(71) Applicant: RichWave Technology Corp., Taipei (TW)

(72) Inventors: Chih-Sheng Chen, Taipei (TW); Tien-Yun Peng, Taipei (TW)

(73) Assignee: RichWave Technology Corp., Taipei (TW)

( * ) Notice: Subject to any disclaimer, the term of this patent is extended or adjusted under 35 U.S.C. 154(b) by 38 days.

(21) Appl. No.: 16/920,739

(22) Filed: Jul. 5, 2020

(65) Prior Publication Data

US 2021/0021290 A1    Jan. 21, 2021

(30) Foreign Application Priority Data

Jul. 15, 2019   (TW) .................................. 108124853

(51) Int. Cl.
*H04B 1/04* (2006.01)
*H03F 3/24* (2006.01)
*H03K 17/04* (2006.01)
*H03F 1/14* (2006.01)

(52) U.S. Cl.
CPC ............... *H04B 1/04* (2013.01); *H03F 3/245* (2013.01); *H03K 17/04* (2013.01); *H03F 2200/294* (2013.01); *H03F 2200/451* (2013.01)

(58) Field of Classification Search
None
See application file for complete search history.

(56) References Cited

U.S. PATENT DOCUMENTS

| | | | | | |
|---|---|---|---|---|---|
| 5,367,268 | A * | 11/1994 | Baba | .................... | H03G 3/3036 |
| | | | | | 330/129 |
| 7,355,476 | B2 * | 4/2008 | Kasha | ...................... | H04B 1/18 |
| | | | | | 330/284 |
| 7,427,894 | B2 * | 9/2008 | Dow | ..................... | H03F 1/0205 |
| | | | | | 330/129 |
| 8,072,272 | B2 * | 12/2011 | Zhao | ........................ | H03F 1/42 |
| | | | | | 330/310 |
| 9,276,527 | B2 * | 3/2016 | Gaynor | ..................... | H03F 3/21 |
| 9,531,334 | B1 * | 12/2016 | Wyse | .................... | H01L 23/645 |

(Continued)

FOREIGN PATENT DOCUMENTS

WO        2018/187245 A1    10/2018

*Primary Examiner* — Pablo N Tran
(74) *Attorney, Agent, or Firm* — Winston Hsu

(57) ABSTRACT

A radio frequency signal transmission circuit includes a direct current blocking unit, a biasing impedance circuit, and a radio frequency element. The direct current blocking unit has a first terminal for receiving an input signal, and a second terminal coupled to a first bias voltage terminal. The biasing impedance circuit has a first terminal coupled to the first bias voltage terminal for providing a first bias voltage, and a second terminal coupled to a second bias voltage terminal for receiving a second bias voltage. The radio frequency element is coupled to the first bias voltage terminal, and receives and processes the input signal. When the biasing impedance circuit operates in a first mode, the biasing impedance circuit provides a first impedance. When the biasing impedance circuit operates in a second mode, the biasing impedance circuit provides a second impedance greater than the first impedance.

19 Claims, 6 Drawing Sheets

(56) References Cited

U.S. PATENT DOCUMENTS

| | | | |
|---|---|---|---|
| 10,879,861 B2* | 12/2020 | Park ......................... | H03F 3/60 |
| 2014/0206301 A1 | 7/2014 | Geddada | |
| 2017/0346464 A1 | 11/2017 | Chang | |
| 2018/0054166 A1 | 2/2018 | Pehlivanoglu | |
| 2018/0054171 A1* | 2/2018 | Pehlivanoglu .......... | H03F 1/223 |
| 2021/0091727 A1* | 3/2021 | Chien .................... | H03L 7/089 |
| 2021/0175857 A1* | 6/2021 | Enomoto ................ | H03F 3/191 |

* cited by examiner

RADIO FREQUENCY SIGNAL TRANSMISSION CIRCUIT WITH A HIGH SWITCHING SPEED

CROSS REFERENCE TO RELATED APPLICATION

This application claims priority of Taiwan application No. 108124853, which was filed on Jul. 15, 2019, and is included herein by reference.

TECHNICAL FIELD

The present invention is related to a radio frequency signal transmission circuit, and more particularly to a radio frequency signal transmission circuit with a high switching speed.

BACKGROUND

In wireless communications, since the operating environment may change with time and location, the transmission signal is often amplified by an amplifier to improve signal transmission quality and reception quality. Generally, the amplifier needs to be biased appropriately by a bias circuit so the gain performance and linearity of the amplifier can meet the requirements.

However, in prior art, to save space, the transmitter and the receiver for radio frequency signals of the electronic device often share the same antenna, and the electronic device will switch between the transmitting function and the receiving function according to the current operation requirements. However, during the switching operation, due to the capacitive effect of the components in the device, the charge accumulation may pull up the bias voltage after the bias circuit is activated; therefore, more time is required for the bias circuit to stabilize the bias voltage to reach the desired preset value. Therefore, before the bias voltage provided by the bias circuit reaches the required steady-state value, the gain and the linearity of the radio frequency element may not be able to meet the requirement, resulting in signal distortion.

SUMMARY

One embodiment of the present invention discloses a radio frequency signal transmission circuit. The radio frequency signal transmission circuit includes a direct current blocking unit, a biasing impedance circuit, and a radio frequency element.

The direct current blocking unit has a first terminal for receiving an input signal, and a second terminal coupled to a first bias voltage terminal. The first biasing impedance circuit has a first terminal coupled to the first bias voltage terminal for providing a first bias voltage, and a second terminal coupled to a second bias voltage terminal for receiving a second bias voltage. The radio frequency element is coupled to the first bias voltage terminal, and is for receiving and processing the input signal.

When the first biasing impedance circuit operates in a first mode, the first biasing impedance circuit provides a first impedance, and when the first biasing impedance circuit operates in a second mode, the first biasing impedance circuit provides a second impedance greater than the first impedance.

DETAILED DESCRIPTION

Figure 1:
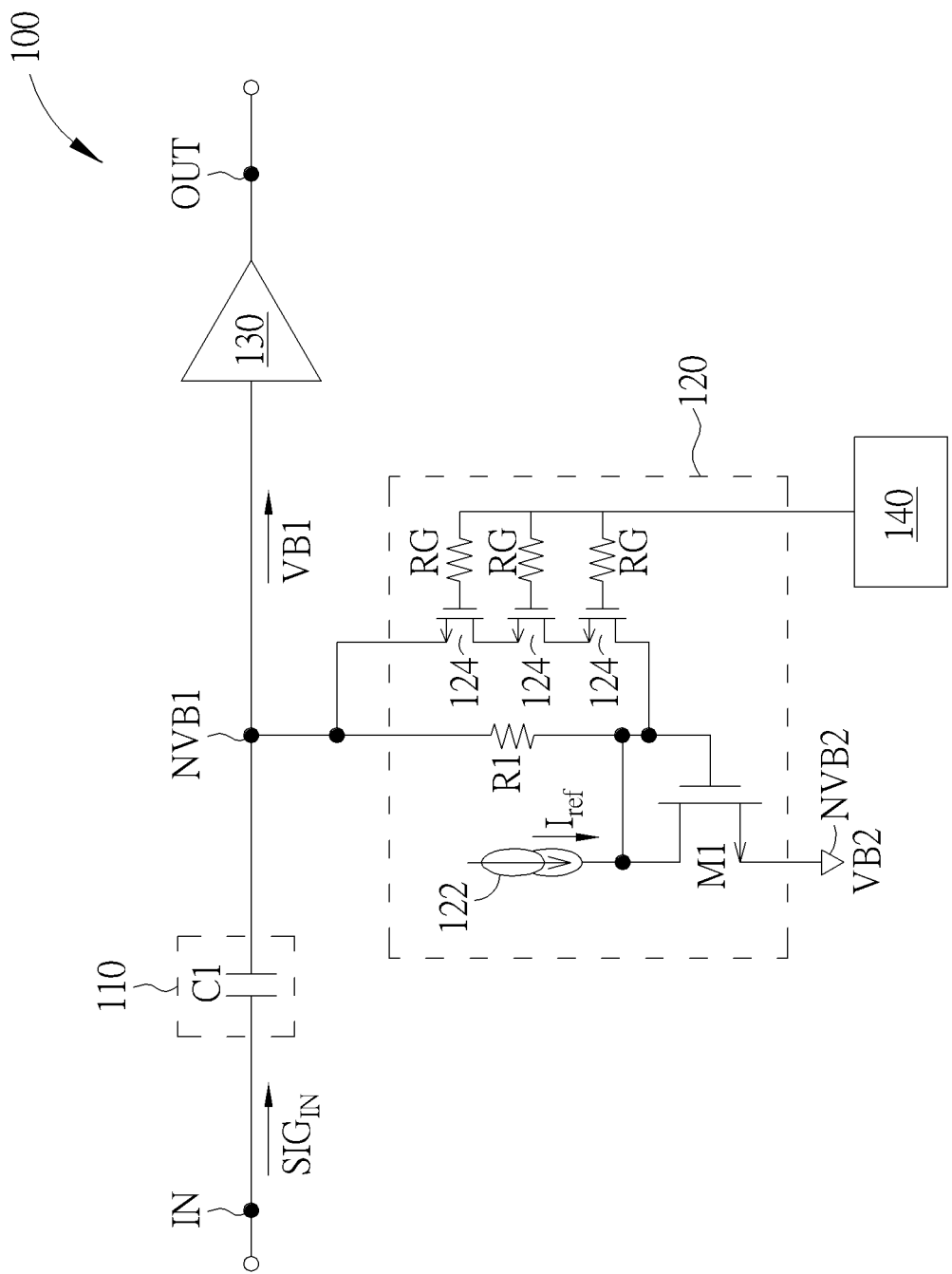
FIG. 1 shows an RF signal transmission circuit according to one embodiment of the present invention.

Below, exemplary embodiments will be described in detail with reference to accompanying drawings so as to be easily realized by a person having ordinary knowledge in the art. The inventive concept may be embodied in various forms without being limited to the exemplary embodiments set forth herein. Descriptions of well-known parts are omitted for clarity, and like reference numerals refer to like elements throughout.

FIG. 1 shows a radio frequency (RF) signal transmission circuit 100 according to one embodiment of the present invention. The RF signal transmission circuit 100 includes a direct current (DC) blocking unit 110, a biasing impedance circuit 120, and a radio frequency element 130. The DC blocking unit 110 has a first terminal coupled to an input terminal IN of the RF signal transmission circuit 100 for receiving an input signal $SIG_{IN}$, and a second terminal coupled to a bias voltage terminal NVB1. In FIG. 1, the DC blocking unit 110 can include a capacitor C1. The capacitor C1 has a first terminal coupled to the first terminal of the DC blocking unit 110, and a second terminal coupled to the second terminal of the DC blocking unit 110.

The biasing impedance circuit 120 has a first terminal and a second terminal. The first terminal of the biasing impedance circuit 120 could be coupled to the bias voltage terminal NVB1 for providing a bias voltage VB1, and the second terminal of the biasing impedance circuit could be coupled to the bias voltage terminal NVB2 for receiving a bias voltage VB2. The RF element 130 could be coupled to the bias voltage terminal NVB1, and could receive and process the input signal $SIG_{IN}$. For example, the RF element 130 could be an active element, such as a low noise amplifier (LNA) or a power amplifier (PA), and it could amplify the input signal $SIG_{IN}$ according to the bias voltage VB1 provided by the biasing impedance circuit 120. The amplified RF signal could be outputted through an output terminal OUT of the RF signal transmission circuit 100. In addition, the bias voltage VB1 could be greater than the bias voltage VB2. For example, the bias voltage VB1 could be 0.4V while the bias voltage VB2 could be, but not limited to, the reference voltage of the system or the ground voltage. In some embodiments, the bias voltage terminal NVB2 may have sufficient capability to source or sink for different levels of loads and to adjust the bias voltage accordingly.

For example, when the biasing impedance circuit 120 is just activated, the bias voltage VB1 generated by the biasing impedance circuit 120 would increase rapidly before it is slowly lowered to the steady-state value required by the predetermined operating condition of the RF element 130. However, in the present invention, the biasing impedance circuit 120 could provide different impedances for different modes so the bias voltage VB1 provided by the biasing impedance circuit 120 could return to the steady-state value more rapidly. To allow the bias voltage VB1 to return to the steady-state value rapidly for providing the required operating condition for the RF element 130, the biasing impedance circuit 120 could enter a first mode when the biasing impedance circuit 120 is activated and the bias voltage VB1 is raised to be higher than the steady-state value. In the first mode, the biasing impedance circuit 120 could provide a first impedance. In contrast, after the biasing impedance circuit 120 is activated, when the bias voltage VB1 returns to the steady-state value, the biasing impedance circuit 120 could enter a second mode. In the second mode, the biasing impedance circuit 120 could provide a second impedance greater than the first impedance.

That is, the biasing impedance circuit 120 could provide a small impedance of the first impedance in the first mode, thereby forming a discharging path between the bias voltage terminal NVB1 and the bias voltage terminal NVB2. Therefore, the bias voltage terminal NVB1 whose voltage is excessively increased could be discharged through the discharging path so as to reduce the voltage and thus shorten the time required for the bias voltage VB1 to reach the steady-state value.

In FIG. 1, the biasing impedance circuit 120 includes a current source 122, a transistor M1, a resistor R1, and a plurality of switches 124. The current source 122 could provide a reference current Iref. The transistor M1 has a first terminal configured to receive the reference current Iref, a second terminal coupled to the second terminal of the biasing impedance circuit 120, and a control terminal coupled to the first terminal of the transistor M1.

The resistor R1 has a first terminal coupled to the first terminal of the biasing impedance circuit 120, and a second terminal coupled to the first terminal of the transistor M1. In FIG. 1, the plurality of switches 124 could be coupled in series between the first terminal of the biasing impedance circuit 120 and the second terminal of the resistor R1. In some embodiments, the plurality of switches 124 could be controlled simultaneously, that is, the switches 124 could be turned on and turned off simultaneously. Also, in some other embodiments, the biasing impedance circuit 120 may include only one switch 124 for control. In addition, in some embodiments, to reduce the distortion of the input signal $SIG_{IN}$ caused by the excessive current consumed by the biasing impedance circuit 120, the resistor R1 could be selected to have a larger resistance. For example, the resistance of the resistor R1 may be 2 million ohms. Since the resistance of the resistor R1 is rather large, it is difficult for the bias voltage terminal NVB1 to be discharged via the resistor R1 when the biasing impedance circuit 120 is just activated and when the bias voltage VB1 is raised beyond the steady state value.

In this case, the biasing impedance circuit 120 will enter the first mode and turn on the switches 124 so the bias terminal NVB1 could be discharged through the switches 124 and make the bias terminal VB1 return to the steady-state value. When the bias voltage VB1 returns to the steady-state value, the biasing impedance circuit 120 will enter the second mode and turn off the switches 124 to reduce the leakage current.

In FIG. 1, the RF signal transmission circuit 100 could further include a control circuit 140. The control circuit 140 could make the biasing impedance circuit 120 enter the first mode when the biasing impedance circuit 120 is activated, and turn on the switches 124 for a period of time. For example, if within 0.2 microseconds after the biasing impedance circuit 120 is activated, the input signal $SIG_{IN}$ at this time does not start to transmit the necessary information yet, the control circuit 140 could generate a pulse signal having a width corresponding to the period of time for turning on the switches 124 accordingly. In some embodiments, the width of the pulse signal could be designed based on the actual operations of the circuit.

Moreover, in some other embodiments, the control circuit 140 could also detect the value of the bias voltage VB1 and, when the bias voltage VB1 is above the steady state value, have the biasing impedance circuit 120 enter the first mode and turn on the switches 124. For example, the control circuit 140 could include a comparator for comparing the bias voltage VB1 with a predetermined reference value. When the bias voltage VB1 is greater than the reference value, the control circuit 140 could output a high operating voltage to turn on the switches 124. When the bias voltage VB1 is smaller than the reference value, the control circuit 140 could output a low operating voltage to turn off the switches 124. In some embodiments, the reference value may be slightly higher than the steady-state value of the bias voltage VB1 to prevent the switches 124 from being unnecessarily turned on. For example, if the steady-state value of the bias voltage VB1 is 1.5V, the reference value may be, for example but not limited to, 1.55V.

In this case, the control circuit 140 could control the biasing impedance circuit 120 to enter the first mode or the second mode according to the magnitude of the bias voltage VB1 even more accurately.

In addition, in FIG. 1, the bias impedance circuit 120 could include a plurality of switches 124 to prevent the switches 124 from being unintentionally turned on when the swing of the input signal $SIG_{IN}$ is too large. However, in some embodiments, if the concern of unintentionally turning on the switch 124 is addressable, the biasing impedance circuit 120 could also utilize one single switch 124 to adjust the impedance of the biasing impedance circuit 120. Furthermore, in FIG. 1, the switch 124 could be implemented by a transistor, and a gate resistor RG could be added to the control terminal of the transistor for reducing the switching noise.

Since the RF signal transmission circuit 100 may adjust the impedance between the bias voltage terminals NVB1 and NVB2 with the biasing impedance circuit 120, the discharging path with smaller impedance could be provided when the bias voltage VB1 is too high (i.e., which is greater than steady-state value), allowing the bias voltage VB1 to return to the steady-state value required by the RF element 130 rapidly.

Figure 2:
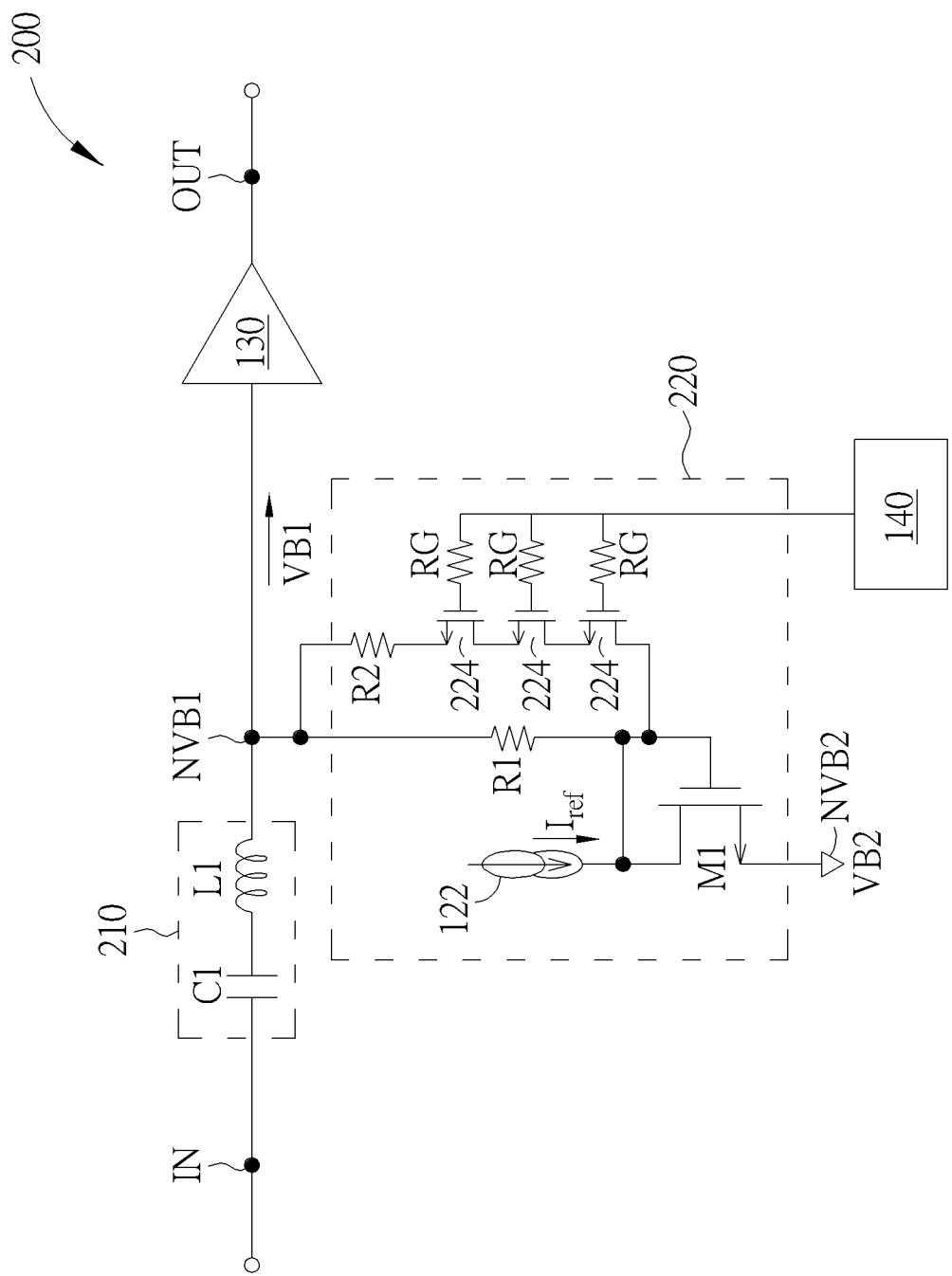
FIG. 2 shows an RF signal transmission circuit according to another embodiment of the present invention.

FIG. 2 shows an RF signal transmission circuit 200 according to another embodiment of the present invention. The RF signal transmission circuit 200 and the RF signal transmission circuit 100 have similar structures, and could be operated with similar principles. However, in FIG. 2, the biasing impedance circuit 220 could further include a resistor R2. The resistor R2 has a first terminal coupled to the first terminal of the biasing impedance circuit 220, and a second terminal. In addition, the switches 224 could be coupled in series between the second terminal of the resistor R2 and the second terminal of the resistor R1. In some embodiments, the resistance of the resistor R2 could be smaller than the resistance of the resistor R1.

In some embodiments, the bias impedance circuit 220 may not be able to complete the discharge via the turned-on switches 224 within a short time, so it may be necessary to turn on the switches 224 for a longer period. In this case, in order to prevent the switches 224 from being turned on for a long time and thus, affect the communication process, the biasing impedance circuit 220 could increase the impedance of the discharge path by the resistor R2, thereby reducing the amount of input signal $SIG_{IN}$ flowing into the discharging path and reducing the signal distortion. Generally, in the initial stage of the wireless communications, the transmitting signals are used to carry preset content only, and are not related to critical information. Therefore, the requirement for the signal quality is rather low for the initial stage of wireless communications. In this case, the resistor R2 could help to reduce the distortion of the input signal $SIG_{IN}$ caused by being discharged via the discharging path. The period of time for staying in the first mode could be extended, and the switches 224 could remain turned on until the initial stage of the wireless communications completes. Consequently, the bias voltage VB1 could return to the steady-state value required by the RF element 130 without affecting the wireless communications. However, in some other embodiments, the designer could also determine the period of time for turning on the switches 224 according to the actual operations and conditions of the circuits, and could also select the resistor R2 with proper resistance for providing the first impedance required by the actual situation.

In addition, in FIG. 2, the DC blocking unit 210 could include a capacitor C1 and an inductor L1. The capacitor C1 has a first terminal coupled to the first terminal of the DC blocking unit 210, and a second terminal. The inductor L1 has a first terminal coupled to the second terminal of the capacitor C1, and a second terminal coupled to the second terminal of the DC blocking unit 210.

Figure 3:
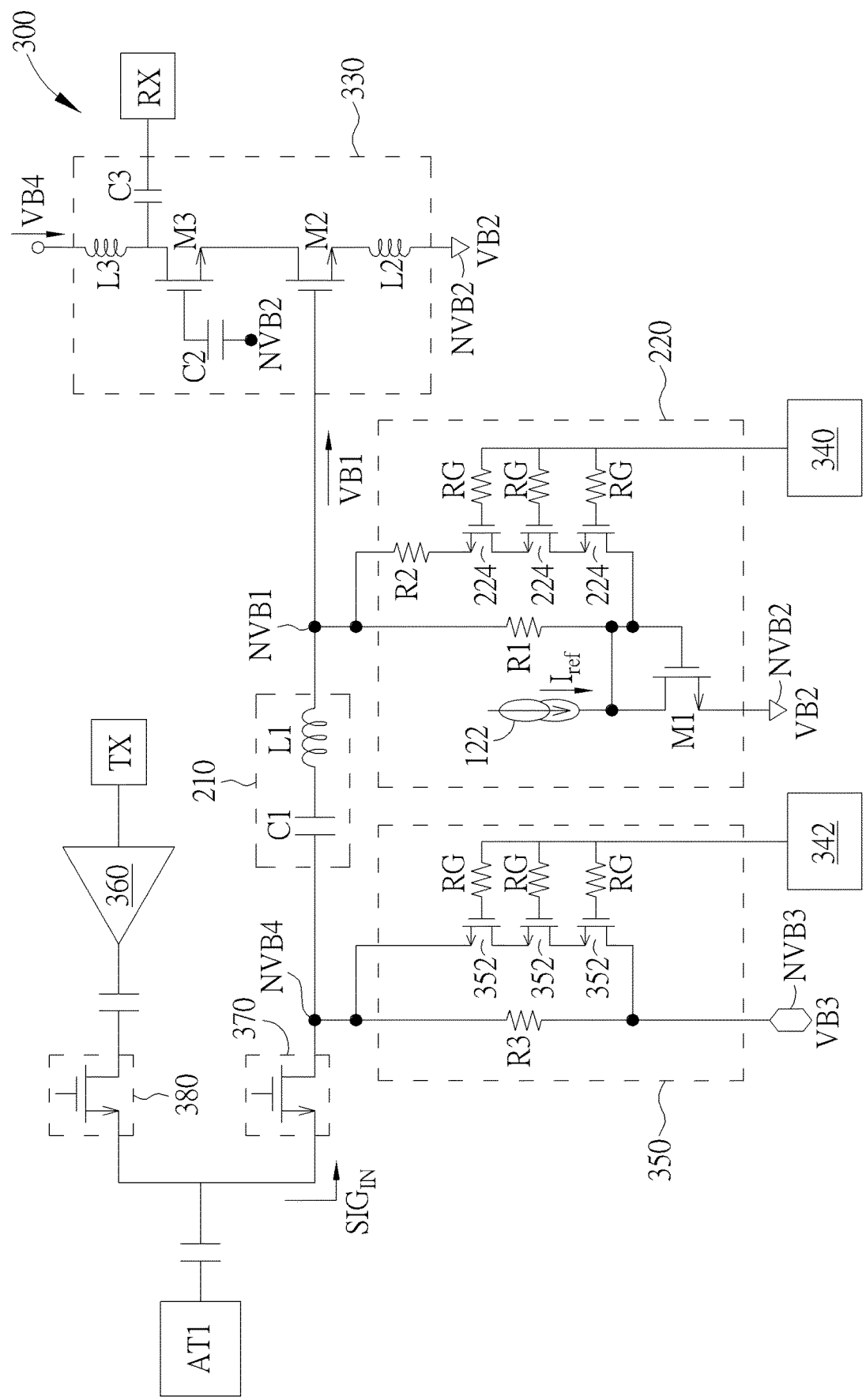
FIG. 3 shows an RF signal transmission circuit according to another embodiment of the present invention.

FIG. 3 shows an RF signal transmission circuit 300 according to one embodiment of the present invention. The RF signal transmission circuit 300 and the RF signal transmission circuit 200 have similar structures and could be operated with similar principles. However, in FIG. 3, the RF signal transmission circuit 300 could include a biasing impedance circuit 350, RF elements 330 and 360, and switch units 370 and 380. The switch units 370 and 380 could be coupled to the transmission unit AT1, and could be used to control the connection between the RF element 330 and the transmission unit AT1 and the connection between the RF element 360 and the transmission unit AT1.

The biasing impedance circuit 350 has a first terminal coupled to the first terminal of the DC blocking unit 210, and a second terminal coupled to the bias voltage terminal NVB3 for receiving a bias voltage VB3. In some embodiments, the bias voltage VB3 could be, for example, 1.5V.

In addition, in the RF signal transmission circuit 300, the RF elements 330 and 360 could use the same transmission unit AT1. For example, the transmission unit AT1 could be, for example but not limited to, an antenna module. The RF element 330 could be, for example but not limited to, a low noise amplifier of the signal receiver, and the RF element 360 could be, for example but not limited to, a power amplifier of the signal transmitter. In this case, the switch unit 370 could be coupled to the transmission unit AT1 and the first terminal of the DC blocking unit 210. When the RF signal transmission circuit 300 operates in the receiving mode, the switch unit 370 is turned on, so that the input signal $SIG_{IN}$ received from the transmission unit AT1 could be transmitted to the RF element 330, and the receiver RX thus could receive the incoming external RF signal. In contrast, when the RF signal transmission circuit 300 operates in the transmission mode, the switch unit 370 is turned off, and the switch unit 380 is turned on. Therefore, the RF component 360 could transmit the signal from the transmitter TX to the transmission unit AT1 via the switch unit 380.

In some embodiments, when the switch unit 370 is turned on from the off state, the voltage of the first terminal NVB4 of the DC blocking unit 210 is raised, causing the switch unit 370 to be unable to be turned on firmly. In this case, the biasing impedance circuit 350 could provide a discharging path having a small impedance to stabilize the voltage of the first terminal NVB4 of the DC blocking unit 210 to the bias voltage VB3 required by the system, when the voltage of the first terminal NVB4 of the DC blocking unit 210 is raised to exceed the bias voltage VB3.

For example, when the voltage of the first terminal NVB4 of the DC blocking unit 210 is raised, the biasing impedance circuit 350 could enter the first mode to provide a third impedance. In addition, when the voltage of the first terminal NVB4 of the DC blocking unit 210 is stabilized to the bias voltage VB3, the biasing impedance circuit 350 could enter the second mode and provide a fourth impedance greater than the third impedance. That is, in the first mode, the biasing impedance circuit 350 could form a discharging path between the first terminal NVB4 of the DC blocking unit 210 and the bias voltage terminal NVB3 via a smaller third impedance. In the present embodiment, the bias voltage terminal NVB3 may have sufficient capability to source or sink different levels of loads and to adjust the bias voltage accordingly.

In FIG. 3, the biasing impedance circuit 350 could include a resistor R3 and switches 352. The resistor R3 has a first terminal coupled to the first terminal of the biasing impedance circuit 350, and a second terminal coupled to the second terminal of the biasing impedance circuit 350. Generally, to avoid the attenuation of the input signal $SIG_{IN}$, a resistor R3 with a larger resistance value could be selected. For example, the resistance of the resistor R3 could be one million ohms. The switches 352 could be coupled in series between the first terminal and the second terminal of biasing impedance circuit 350. In this case, the impedance provided by the biasing impedance circuit 350 could be controlled by turning on or off the switches 352.

In the first mode, since the switches 352 would be turned on, a discharging path with a smaller impedance between the first terminal NVB4 of the DC blocking unit 210 and the bias voltage terminal NVB3 is formed, and the voltage of the first terminal NVB4 of the DC blocking unit 210 could thus return to the bias voltage VB3 even more rapidly.

In some embodiments, the RF signal transmission circuit 300 could control the switches 224 of the biasing impedance circuit 220 by the control circuit 340, and could control the switches 352 of the biasing impedance circuit 350 by the control circuit 342, so the biasing impedance circuits 220 and 350 could be switched between the first mode and the second mode. In some embodiments, the control circuits 340 and 342 could control the biasing impedance circuits 220 and 350 in different ways. For example, the control circuit 340 could generate a pulse signal having a specific width to turn on the switches 224, while the control circuit 342 could compare the voltage of the first terminal NVB4 of the DC blocking unit 210 with a predetermined reference value, and to turn on or off the switches 352 according to the comparing result. However, in some other embodiments, the RF signal transmission circuit 300 could also use the same control circuit to control the biasing impedance circuits 220 and 350.

In FIG. 3, the RF element 330 could be a low noise amplifier, and could include transistors M2 and M3, inductors L2 and L3, and capacitors C2 and C3. The transistor M2 has a first terminal, a second terminal, and a control terminal coupled to the bias voltage terminal NVB1. The inductor L2 has a first terminal and a second terminal. The first terminal of the inductor L2 could be coupled to the second terminal of the transistor M2, and the second terminal of the inductor L2 could be coupled to the bias voltage terminal NVB2. The transistor M3 has a first terminal, a second terminal coupled to the first terminal of the transistor M2, and a control terminal. The capacitor C2 has a first terminal coupled to the bias voltage terminal NVB2, and a second terminal coupled to the control terminal of the transistor M3. The inductor L3 has a first terminal configured to receive the bias voltage VB4, and a second terminal coupled to the first terminal of the transistor M3. The capacitor C3 has a first terminal coupled to the first terminal of the transistor M3, and a second terminal configured to output an amplified signal.

Figure 4:
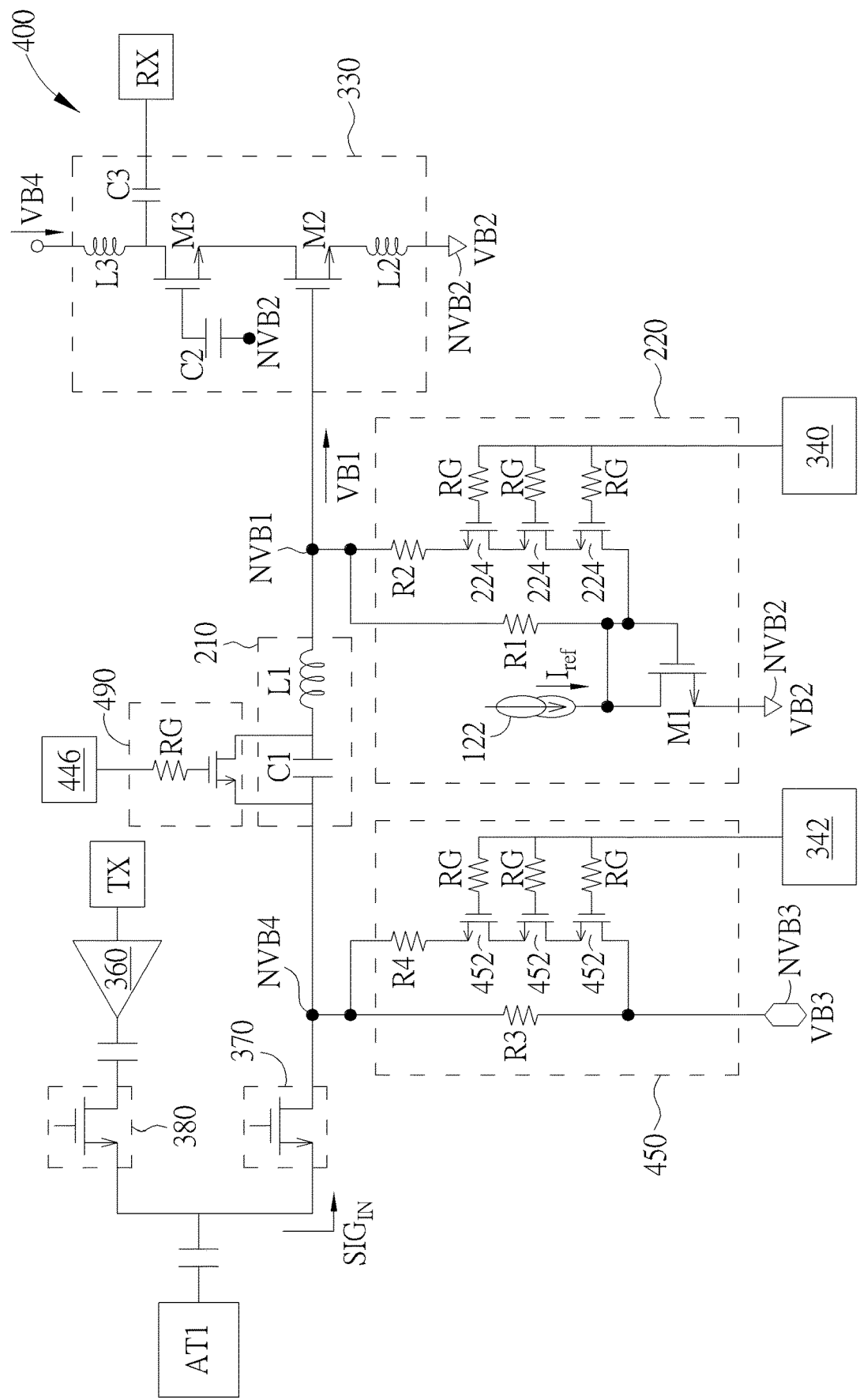
FIG. 4 shows an RF signal transmission circuit according to another embodiment of the present invention.

FIG. 4 shows an RF signal transmission circuit 400 according to one embodiment of the present invention. The RF signal transmission circuit 400 and the RF signal transmission circuit 300 have similar structures, and could be operated with similar principles. However, in FIG. 4, the RF signal transmission circuit 400 could further include a biasing impedance circuit 450 and a switch 490.

The biasing impedance circuit 450 could include a resistor R4 and switches 452. The resistor R4 include a first terminal coupled to a first terminal of the biasing impedance circuit 450, and the switches 452 could be coupled in series between a second terminal of the resistor R4 and a second terminal of the biasing impedance circuit 450. In some embodiments, the resistance of the resistor R4 could be smaller than the resistance of the resistor R3. Since the resistor R4 could be used to increase the impedance of the discharging path, the portion of the input signal $SIG_{IN}$ flowing into the discharging path provided by the biasing impedance circuit 450 could be reduced, and thus, the signal distortion caused by attenuation could also be reduced. Therefore, the time that the biasing impedance circuit 450 keeps the switches 452 turned on could be extended.

In addition, in FIG. 4, the RF signal transmission circuit 400 could also provide a discharging path to the first terminal NVB4 of the DC blocking unit 210 through the switch 490. For example, the switch 490 could be coupled to the first terminal and the second terminal of the capacitor C1. In the first mode, the switch 490 would be turned on, and in the second mode, the switch 490 would be turned off. Consequently, in the first mode, the switch 490 could form an electrical connection between the first terminal and the second terminal of the capacitor C1, so that the charge accumulated at the first end NVB4 of the DC blocking unit 210 could be discharged to the bias terminal NVB2 through the switch 490 and the biasing impedance circuit 220, thereby allowing the voltage of the first terminal NVB4 of the DC blocking unit 210 to return to the bias voltage VB3 rapidly. Furthermore, in FIG. 3 and FIG. 4, switches 352, 452, and 490 could be implemented with transistors, and gate resistors RG may be added in front of the control terminals to reduce the switching noise. In the embodiment of FIG. 4, the RF signal transmission circuit 400 may further include a control circuit 446, and the control circuit 446 could be used to turn on or off the switch 490. In some embodiments, the control circuits 340, 342, and 446 could also be implemented by using the same control circuitry.

Figure 5:
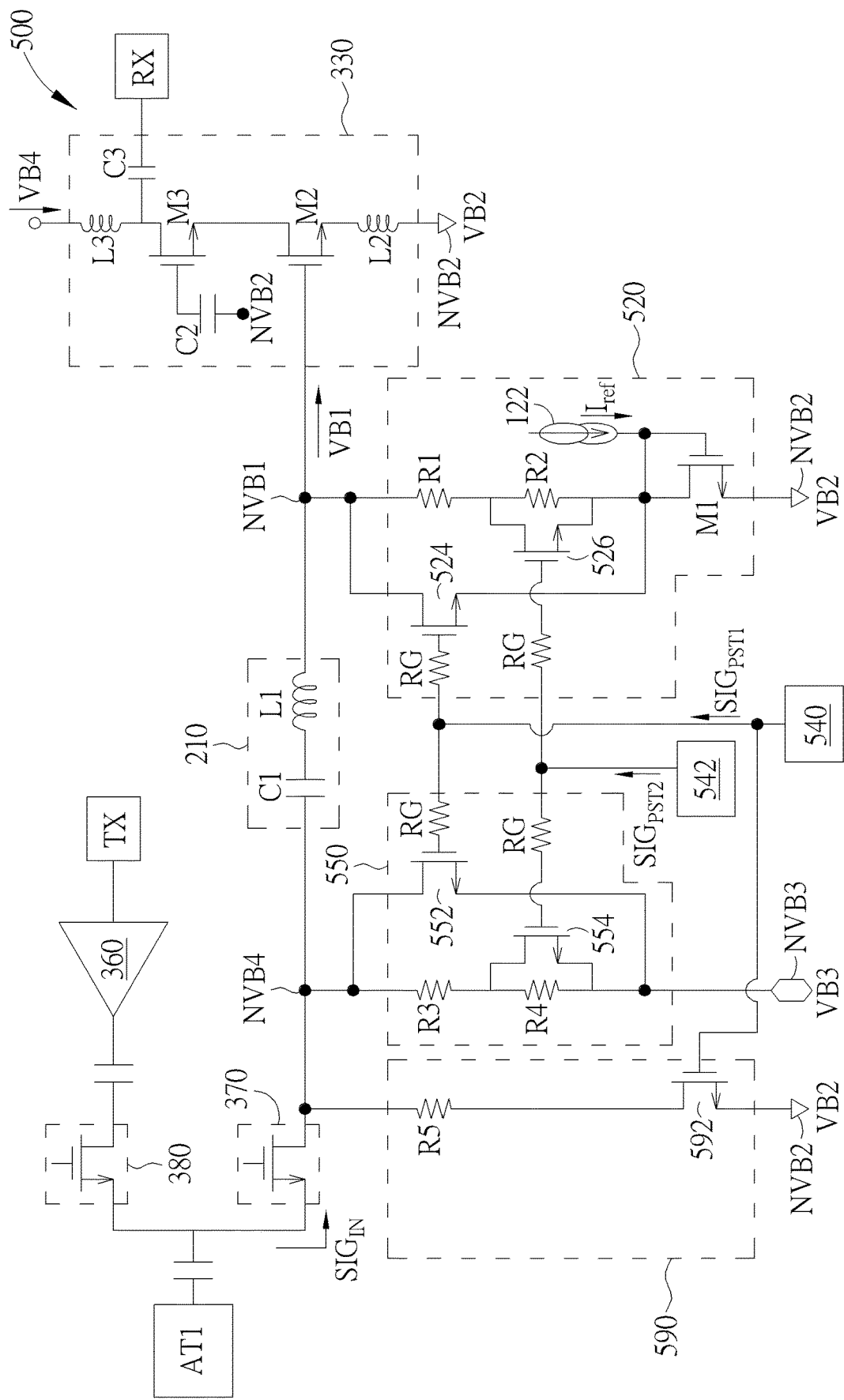
FIG. 5 shows an RF signal transmission circuit according to another embodiment of the present invention.

FIG. 5 shows an RF signal transmission circuit 500 according to one embodiment of the present invention. The RF signal transmission circuit 500 and the RF signal transmission circuit 300 have similar structures, and could be operated with similar principles. However, in FIG. 5, the RF signal transmission circuit 500 could include biasing impedance circuits 520, 550, and 590.

The biasing impedance circuit 520 could include a current source 122, a transistor M1, resistors R1 and R2, and switches 524 and 526. The biasing impedance circuit 520 has a first terminal coupled to the bias voltage terminal NVB1 for providing a bias voltage VB1, and a second terminal coupled to the bias voltage terminal NVB2 for receiving the bias voltage VB2.

The transistor M1 has a first terminal for receiving the reference current $I_{ref}$, a second terminal coupled to the second terminal of the biasing impedance circuit 520, and a control terminal coupled to the first terminal of the transistor M1. The resistor R1 has a first terminal coupled to the first terminal of the biasing impedance circuit 520, and a second terminal. The resistor R2 has a first terminal coupled to the second terminal of the resistor R1, and a second terminal coupled to the first terminal of the transistor M1. The switch 524 includes a first terminal coupled to the first terminal of the biasing impedance circuit 520, a second terminal coupled to the second terminal of the resistor R2, and a control terminal for receiving a preset signal $SIG_{PST1}$. The switch 526 includes a first terminal coupled to the first terminal of the resistor R2, a second terminal coupled to the second terminal of the resistor R2, and a control terminal for receiving the preset signal $SIG_{PST2}$.

Figure 6:
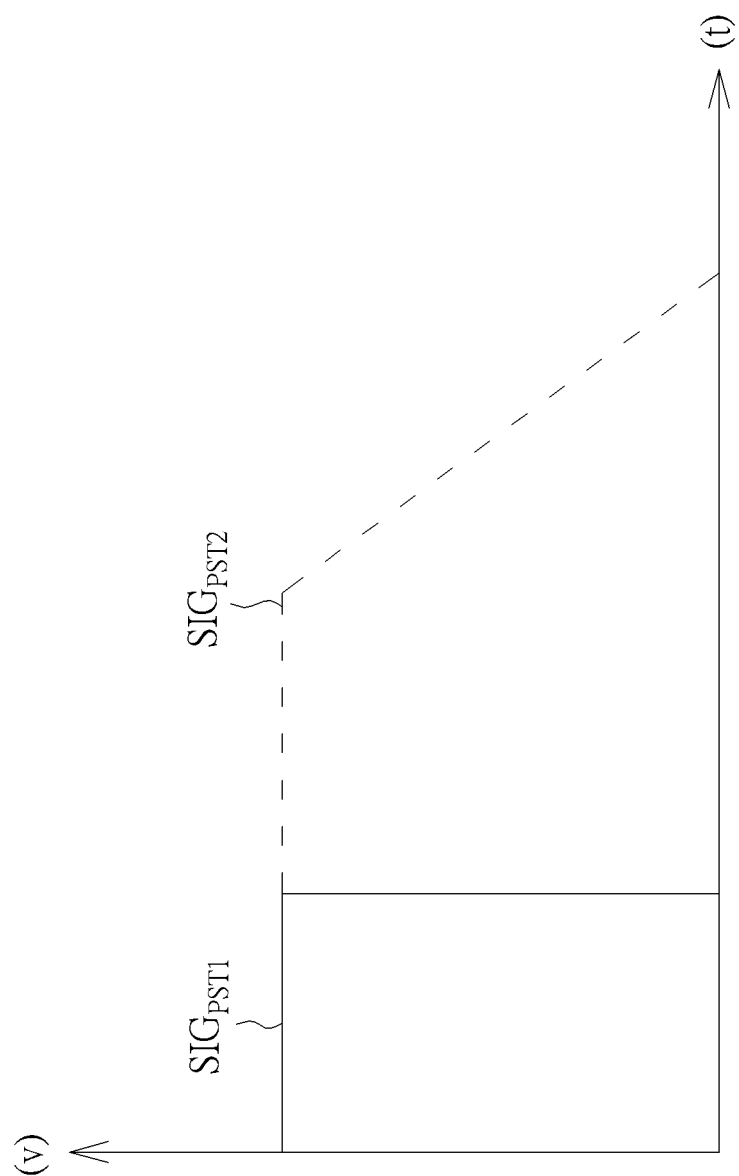
FIG. 6 is a waveform diagram of preset signals according to one embodiment of the present invention.

In FIG. 5, the control terminals of the switches 524 and 526 could respectively receive the preset signal $SIG_{PST1}$ and $SIG_{PST2}$ through the gate resistors RG. In addition, in some embodiments, the preset signal $SIG_{PST1}$ could be generated by the control circuit 540, and the preset signal $SIG_{PST2}$ could be generated by the control circuit 542. The preset signals $SIG_{PST1}$ and $SIG_{PST2}$ could be pulse signals that are substantially equal, and could turn on the switches 524 and 526 in the first mode, forming a discharging path having a low impedance between the bias voltage terminals NVB1 and NVB2. However, in some embodiments, the pulse width of the preset signals $SIG_{PST2}$ could be greater than the pulse width of the preset signals $SIG_{PST1}$. That is, in the first mode, the switch 526 could be turned on for a longer period of time, and the biasing impedance circuit 520 thus could extend the time of the first mode for providing the discharging path with a slightly higher impedance, so that the bias voltage VB1 could reliably return to the steady-state value required by the RF element 330. Moreover, to avoid the noise generated when the switch 526 is turned off in an instant, in some embodiments, the preset signal $SIG_{PST2}$ may also have a gradually weakened waveform. FIG. 6 is a waveform diagram of preset signals $SIG_{PST1}$ and $SIG_{PST2}$ according to one embodiment of the present invention;

The biasing impedance circuit 550 includes resistors R3, R4 and switches 552 and 554. The biasing impedance circuit 550 includes a first terminal coupled to the first terminal NVB4 of the DC blocking unit 210, and the second terminal coupled to the bias terminal NVB3 for receiving the bias voltage VB3. The resistor R3 has a first terminal coupled to the first terminal of the biasing impedance circuit 550, and a second terminal. The resistor R4 has a first terminal coupled to the second terminal of the resistor R3, and a second terminal coupled to the second terminal of the biasing impedance circuit 550. The switch 552 includes a first terminal coupled to the first terminal of the biasing impedance circuit 550, a second terminal coupled to the second terminal of the resistor R4, and a control terminal for receiving the preset signal $SIG_{PST1}$. The switch 554 includes a first terminal coupled to the first terminal of the resistor R4, a second terminal coupled to the second terminal of the resistor R4, and a control terminal for receiving the preset signal $SIG_{PST2}$. In FIG. 5, the control terminals of the switches 552 and 554 could receive the preset signals $SIG_{PST1}$ and $SIG_{PST2}$ through the gate resistors RG. In the first mode, the switches 552 and 554 are turned on so a discharging path with a low impedance between the first terminal NVB4 of the DC blocking unit 210 and the bias voltage terminal NVB3 is formed, allowing the voltage of the first terminal NVB4 of the DC blocking unit 210 to return to the bias voltage VB3 required by the system. While the voltage of the first terminal NVB4 of the DC blocking unit 210 is stabilized at the bias voltage VB3, the biasing impedance circuit 550 would enter the second mode and turn off the switches 552 and 554.

The biasing impedance circuit 590 could include a resistor R5 and a switch 592. The biasing impedance circuit 590 has a first terminal coupled to the first terminal NVB4 of the DC blocking unit 210, and a second terminal coupled to the bias voltage terminal NVB2 for receiving the bias voltage VB2. The resistor R5 has a first terminal coupled to the first terminal of the biasing impedance circuit 590, and a second terminal. The switch 592 includes a first terminal coupled to the second terminal of the resistor R5, a second terminal coupled to the second terminal of the biasing impedance circuit 590, and a control terminal for receiving the preset signal $SIG_{PST1}$. In FIG. 5, the control terminal of the switch 592 could receive the preset signal $SIG_{PST1}$ through the gate resistor RG. In some embodiments, if the discharging ability of the discharging path formed by the biasing impedance circuit 550 is not sufficient, the time for the voltage of the first terminal NVB4 of the DC blocking unit 210 to return to the steady-state value will be too long. In this case, the switch 592 of the biasing impedance circuit 590 could be turned on, thereby forming a discharging path with a low impedance between the first terminal NVB4 of the DC blocking unit 210 and the bias voltage terminal NVB2 and assisting the voltage of the first terminal NVB4 of the DC blocking unit 210 to return to the steady-state value required by the system faster.

Since the RF signal transmission circuit 500 could provide discharging paths having smaller impedance in the first mode by the biasing impedance circuits 520, 550, and 590, the bias voltage VB1 and the voltage of the first terminal of the DC blocking unit 210 could return to the steady-state values required by the system rapidly.

In summary, the RF signal transmission circuits provided by the embodiments of the present invention could provide different impedances in different modes with the biasing impedance circuits, so the RF signal transmission circuits can provide the bias conditions required for the elements therein within a short time. Therefore, the issues that the operating characteristics of the RF elements are affected and signal loss or signal distortion due to the bias voltage reaching the steady-state value for too long could be avoided.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A radio frequency signal transmission circuit comprising:
    a direct current blocking unit having a first terminal configured to receive an input signal, and a second terminal coupled to a first bias voltage terminal;
    a first biasing impedance circuit having a first terminal coupled to the first bias voltage terminal for providing a first bias voltage, and a second terminal coupled to a second bias voltage terminal for receiving a second bias voltage; and
    a radio frequency element coupled to the first bias voltage terminal, and configured to receive and process the input signal;
    wherein:
    when the first biasing impedance circuit operates in a first mode, the first biasing impedance circuit is further configured to provide a first impedance;
    when the first biasing impedance circuit operates in a second mode, the first biasing impedance circuit is further configured to provide a second impedance, wherein the first impedance is smaller than the second impedance; and
    when the first biasing impedance circuit is activated and raises the first bias voltage to be higher than a steady-state value, the first biasing impedance circuit enters the first mode.

2. The radio frequency signal transmission circuit of claim 1, wherein when the first biasing impedance circuit operates in the first mode, the first biasing impedance circuit provides the first impedance to form a discharging path between the first bias voltage terminal and the second bias voltage terminal.

3. The radio frequency signal transmission circuit of claim 1, wherein when the first biasing impedance circuit is activated and the first bias voltage returns to the steady-state value, the first biasing impedance circuit enters the second mode.

4. The radio frequency signal transmission circuit of claim 1, wherein the first biasing impedance circuit comprises:
    a current source configured to provide a reference current;
    a first transistor having a first terminal configured to receive the reference current, a second terminal coupled to the second terminal of the first biasing impedance circuit, and a control terminal coupled to the first terminal of the first transistor;
    a first resistor having a first terminal coupled to the first terminal of the first biasing impedance circuit, and a second terminal coupled to the first terminal of the first transistor; and
    at least one first switch coupled in series between the first terminal of the first biasing impedance circuit and the second terminal of the first resistor, and configured to form an electrical connection between the first terminal and the second terminal of the first biasing impedance circuit in the first mode, and cut off the electrical connection in the second mode.

5. The radio frequency signal transmission circuit of claim 4, wherein the first biasing impedance circuit further comprises:
    a second resistor having a first terminal coupled to the first terminal of the first biasing impedance circuit, and a second terminal;
    wherein:
    a resistance of the second resistor is smaller than a resistance of the first resistor; and
    the at least one first switch is coupled in series between the second terminal of the second resistor and the second terminal of the first resistor.

6. The radio frequency signal transmission circuit of claim 4, further comprising a control circuit configured to have the first biasing impedance circuit enter the first mode, and turn on the at least one first switch for a period of time when the first biasing impedance circuit is activated or when the first bias voltage is greater than a steady-state value.

7. The radio frequency signal transmission circuit of claim 1, wherein the direct current blocking unit comprises a first capacitor having a first terminal coupled to the first terminal of the direct current blocking unit, and a second terminal.

8. The radio frequency signal transmission circuit of claim 7, wherein the direct current blocking unit further comprises a first inductor having a first terminal coupled to the second terminal of the first capacitor, and a second terminal coupled to the second terminal of the direct current blocking unit.

9. The radio frequency signal transmission circuit of claim 7, further comprising a second switch coupled to the first terminal and the second terminal of the first capacitor, and configured to form an electrical connection between the first terminal and the second terminal of the first capacitor in the first mode, and cut off the electrical connection in the second mode.

10. The radio frequency signal transmission circuit of claim 1, further comprising:
a switch unit coupled to a transmission unit and the first terminal of the direct current blocking unit, and configured to receive the input signal through the transmission unit, and transmit the input signal to the first terminal of the direct current blocking unit according to a control signal.

11. The radio frequency signal transmission circuit of claim 1, further comprising:
a second biasing impedance circuit having a first terminal coupled to the first terminal of the direct current blocking unit, and a second terminal coupled to a third bias voltage terminal, and the second biasing impedance circuit being configured to provide a third bias voltage to the first terminal of the direct current blocking unit;
wherein:
when the second biasing impedance circuit operates in the first mode, the second biasing impedance circuit is configured to provide a third impedance; and
when the second biasing impedance circuit operates in the second mode, the second biasing impedance circuit is configured to provide a fourth impedance, wherein the third impedance is smaller than the fourth impedance.

12. The radio frequency signal transmission circuit of claim 11, wherein when the second biasing impedance circuit operates in the first mode, the second biasing impedance circuit provides the third impedance to form a discharging path between the first terminal of the direct current blocking unit and the third bias voltage terminal.

13. The radio frequency signal transmission circuit of claim 11, wherein the second biasing impedance circuit comprises:
a third resistor having a first terminal coupled to the first terminal of the second biasing impedance circuit, and a second terminal coupled to the second terminal of the second biasing impedance unit; and
at least one third switch coupled in series between the first terminal and the second terminal of the second biasing impedance unit, and configured to form an electrical connection between the first terminal and the second terminal of the second biasing impedance circuit in the first mode, and cut off the electrical connection in the second mode.

14. The radio frequency signal transmission circuit of claim 13, wherein the second biasing impedance circuit further comprises:
a fourth resistor having a first terminal coupled to the first terminal of the second biasing impedance circuit, and a second terminal;

wherein:
resistance of the fourth resistor is smaller than resistance of the third resistor; and
the at least one third switch is coupled in series between the second terminal of the fourth resistor and the second terminal of the second biasing impedance circuit.

15. The radio frequency signal transmission circuit of claim 1, wherein the first bias voltage is greater than the second bias voltage.

16. The radio frequency signal transmission circuit of claim 1, wherein the radio frequency element comprises:
a second transistor having a first terminal, a second terminal, and a control terminal coupled to the first bias voltage terminal;
a second inductor having a first terminal coupled to the second terminal of the second transistor, and a second terminal coupled to the second bias voltage terminal;
a third transistor having a first terminal, a second terminal coupled to the first terminal of the second transistor, and a control terminal;
a second capacitor having a first terminal coupled to the second bias voltage terminal, and a second terminal coupled to the control terminal of the third transistor;
a third inductor having a first terminal configured to receive a fourth bias voltage, and a second terminal coupled to the first terminal of the third transistor; and
a third capacitor having a first terminal coupled to the first terminal of the third transistor, and a second terminal configured to output an amplified signal.

17. The radio frequency signal transmission circuit of claim 1, wherein the first biasing impedance circuit comprises:
a current source configured to provide a reference current;
a first transistor having a first terminal configured to receive the reference current, a second terminal coupled to the second terminal of the first biasing impedance circuit, and a control terminal coupled to the first terminal of the first transistor;
a first resistor having a first terminal coupled to the first terminal of the first biasing impedance circuit, and a second terminal;
a second resistor having a first terminal coupled to the second terminal of the first resistor, and a second terminal coupled to the first terminal of the first transistor;
a first switch having a first terminal coupled to the first terminal of the first biasing impedance circuit, and a second terminal coupled to the second terminal of the second resistor; and
a second switch having a first terminal coupled to the first terminal of the second resistor, and a second terminal coupled to the second terminal of the second resistor;
wherein the first switch and the second switch are configured to form an electrical connection between the first terminal and the second terminal of the first biasing impedance circuit in the first mode, and cut off the electrical connection in the second mode.

18. The radio frequency signal transmission circuit of claim 1, further comprising a second biasing impedance circuit having a first terminal coupled to the first terminal of the direct current blocking unit, and a second terminal coupled to a third bias voltage terminal, and configured to provide a third bias voltage to the first terminal of the direct current blocking unit, the second biasing impedance circuit comprising:

a third resistor having a first terminal coupled to the first terminal of the second bias impedance circuit, and a second terminal;

a fourth resistor having a first terminal coupled to the second terminal of the third resistor, and a second terminal coupled to a third bias voltage terminal;

a third switch having a first terminal coupled to the first terminal of the second biasing impedance circuit, and a second terminal coupled to the second terminal of the fourth resistor; and a fourth switch having a first terminal coupled to the first terminal of the fourth resistor, and a second terminal coupled to the second terminal of the fourth resistor;

wherein the third switch and the fourth switch are configured to form an electrical connection between the first terminal and the second terminal of the second biasing impedance circuit in the first mode, and cut off the electrical connection in the second mode.

19. The radio frequency signal transmission circuit of claim 1, further comprising a third biasing impedance circuit having a first terminal coupled to the first terminal of the direct current blocking unit, and a second terminal coupled to the second bias voltage terminal, and configured to provide the second bias voltage to the first terminal of the direct current blocking unit, the third biasing impedance circuit comprising:

a fifth resistor having a first terminal coupled to the first terminal of the third biasing impedance circuit, and a second terminal; and a fifth switch having a first terminal coupled to the second terminal of the fifth resistor, a second terminal coupled to the second bias voltage terminal, and configured to form an electrical connection between the first terminal and the second terminal of the third biasing impedance circuit in the first mode, and cut off the electrical connection in the second mode.

* * * * *